United States Patent
Arizono et al.

(10) Patent No.: US 9,709,633 B2
(45) Date of Patent: Jul. 18, 2017

(54) BATTERY CAPACITY DISPLAY APPARATUS AND BATTERY CAPACITY DISPLAY METHOD

(75) Inventors: Hidetoshi Arizono, Atsugi (JP); Takashi Iimori, Tokyo (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 736 days.

(21) Appl. No.: 13/702,643

(22) PCT Filed: May 16, 2011

(86) PCT No.: PCT/JP2011/002710
§ 371 (c)(1),
(2), (4) Date: Dec. 7, 2012

(87) PCT Pub. No.: WO2011/155128
PCT Pub. Date: Dec. 15, 2011

(65) Prior Publication Data
US 2013/0076366 A1    Mar. 28, 2013

(30) Foreign Application Priority Data

Jun. 8, 2010   (JP) ................................. 2010-130765

(51) Int. Cl.
| | |
|---|---|
| G01N 27/416 | (2006.01) |
| G01R 31/36 | (2006.01) |
| H01M 10/48 | (2006.01) |
| H02J 7/00 | (2006.01) |

(52) U.S. Cl.
CPC ..... *G01R 31/3606* (2013.01); *G01R 31/3689* (2013.01); *H01M 10/48* (2013.01); *H02J 7/0047* (2013.01)

(58) Field of Classification Search
USPC ......................................................... 324/435
See application file for complete search history.

(56) References Cited

U.S. PATENT DOCUMENTS

| | | | | |
|---|---|---|---|---|
| 5,612,608 A | * | 3/1997 | Ishiguro et al. | ......... 340/636.12 |
| 6,495,989 B1 | | 12/2002 | Eguchi | |
| 7,679,328 B2 | * | 3/2010 | Mizuno et al. | ............... 320/132 |

FOREIGN PATENT DOCUMENTS

| | | |
|---|---|---|
| JP | 5-172915 A | 7/1993 |
| JP | 7-198808 A | 8/1995 |
| JP | 2000-69683 A | 3/2000 |
| JP | 2008-61362 A | 3/2008 |

* cited by examiner

*Primary Examiner* — Robert Grant
(74) *Attorney, Agent, or Firm* — Foley & Lardner LLP

(57) ABSTRACT

A battery capacity display method to display a full charge capacity of a battery and a residual capacity of the battery, respectively, as a full charge capacity display value and a residual capacity display value, the battery capacity display method includes: correcting the full charge capacity display value and/or the residual capacity display value so as to decrease a difference between the full charge capacity display value and the residual capacity display value when the battery is in the full charge state and the full charge capacity and the residual capacity in the full charge state are different from each other, and displaying a corrected full charge capacity display value and/or a corrected residual capacity display value.

11 Claims, 5 Drawing Sheets

BATTERY CAPACITY DISPLAY APPARATUS AND BATTERY CAPACITY DISPLAY METHOD

TECHNICAL FIELD

This invention relates to a battery capacity display apparatus and a battery capacity display method.

BACKGROUND ART

A Japanese Patent Application Publication No. 5-172915 discloses a battery capacity display apparatus configured to calculate a full charge capacity indicative of a charge capacity in a full charge state of a battery, and a residual capacity indicative of a charge capacity at present time, and to display the calculated full charge capacity and the calculated residual capacity of the battery.

SUMMARY OF INVENTION

However, in the conventional apparatus, the residual capacity of the battery may be displayed by a value greater than the full charge capacity indicative of the charge capacity in the full charge state of the battery due to the calculation error of the full charge capacity and the residual capacity of the battery, and the full charge capacity and the residual capacity of the battery may be displayed by different values even in the full charge state of the battery. This may cause an unnatural feeling to a user.

It is, therefore, an object of the present invention to provide a battery capacity display apparatus devised to decrease an unnatural feeling to a user when a full charge capacity and a residual capacity of a battery are displayed.

According to one aspect of the present invention, a battery capacity display apparatus comprises: a full charge capacity sensing section configured to sense a full charge capacity of a battery; a residual capacity sensing section configured to sense a residual capacity of the battery; a displaying section configured to display the full charge capacity sensed by the full charge capacity sensing section, and the residual capacity sensed by the residual capacity sensing section, respectively, as a full charge capacity display value and a residual capacity display value; a charge state sensing section configured to sense a charge state of the battery; a correction section configured to correct the full charge capacity display value and/or the residual capacity display value which are displayed in the displaying section; and a control section configured to display, in the displaying section, a corrected full charge capacity display value and/or a corrected residual capacity display value when the correction section corrects the full charge capacity display value and/or the residual capacity display value, the correction section being configured to compare the full charge capacity and the residual capacity in the full charge state when the charge state sensing section judges that the battery is in the full charge state, and to correct the full charge capacity display value and/or the residual capacity display value which are displayed in the displaying section so as to decrease a difference between the full charge capacity display value and the residual capacity display value when the correction section judges that the full charge capacity and the residual capacity in the full charge state are different from each other.

According to another aspect of the invention, a battery capacity display apparatus comprises: a full charge capacity sensing section configured to sense a full charge capacity of a battery; a residual capacity sensing section configured to sense a residual capacity of the battery; a displaying section configured to display the full charge capacity sensed by the full charge capacity sensing section, and the residual capacity sensed by the residual capacity sensing section, respectively, as a full charge capacity display value and a residual capacity display value; a charge state sensing section configured to sense a charge state of the battery; a correction section configured to correct the full charge capacity display value and/or the residual capacity display value which are displayed in the displaying section; and a control section configured to display, in the displaying section, a corrected full charge capacity display value and/or a corrected residual capacity display value when the correction section corrects the full charge capacity display value and/or the residual capacity display value, the correction section being configured to compare the full charge capacity display value and/or the full charge capacity, and the residual capacity when the charge state sensing section judges that the battery is not in the full charge state, and to correct the full charge capacity display value and/or the residual capacity display value which are displayed in the displaying section so as to decrease a difference between the full charge capacity display value and the residual capacity display value when the correction section judges that the residual capacity is greater than the full charge capacity display value and/or the full charge capacity.

According to still another aspect of the invention, a battery capacity display method to display a full charge capacity of a battery and a residual capacity of the battery, respectively, as a full charge capacity display value and a residual capacity display value, the battery capacity display method comprises: correcting the full charge capacity display value and/or the residual capacity display value so as to decrease a difference between the full charge capacity display value and the residual capacity display value when the battery is in the full charge state and the full charge capacity and the residual capacity in the full charge state are different from each other, and displaying a corrected full charge capacity display value and/or a corrected residual capacity display value.

According to still another aspect of the invention, a battery capacity display method to display a full charge capacity of a battery and a residual capacity of the battery, respectively, as a full charge capacity display value and a residual capacity display value, the battery capacity display method comprises: correcting the full charge capacity display value and/or the residual capacity display value so as to decrease a difference between the full charge capacity display value and the residual capacity display value when the battery is not in the full charge state and the residual capacity display value is greater than the full charge capacity display value and/or the full charge capacity, and displaying the corrected full charge capacity display value and/or the residual capacity display value.

BEST MODE FOR CARRYING OUT THE INVENTION

Hereinafter, one embodiment according to the present invention is illustrated with reference to the drawings. A battery capacity display apparatus according to the embodiment of the present invention is applicable to batteries of an electric vehicle, a hybrid vehicle, and an engine vehicle, and also a battery used for an apparatus other than the vehicle. In the embodiment of the present invention, the battery capacity display apparatus is applied to a vehicle.

Figure 1:
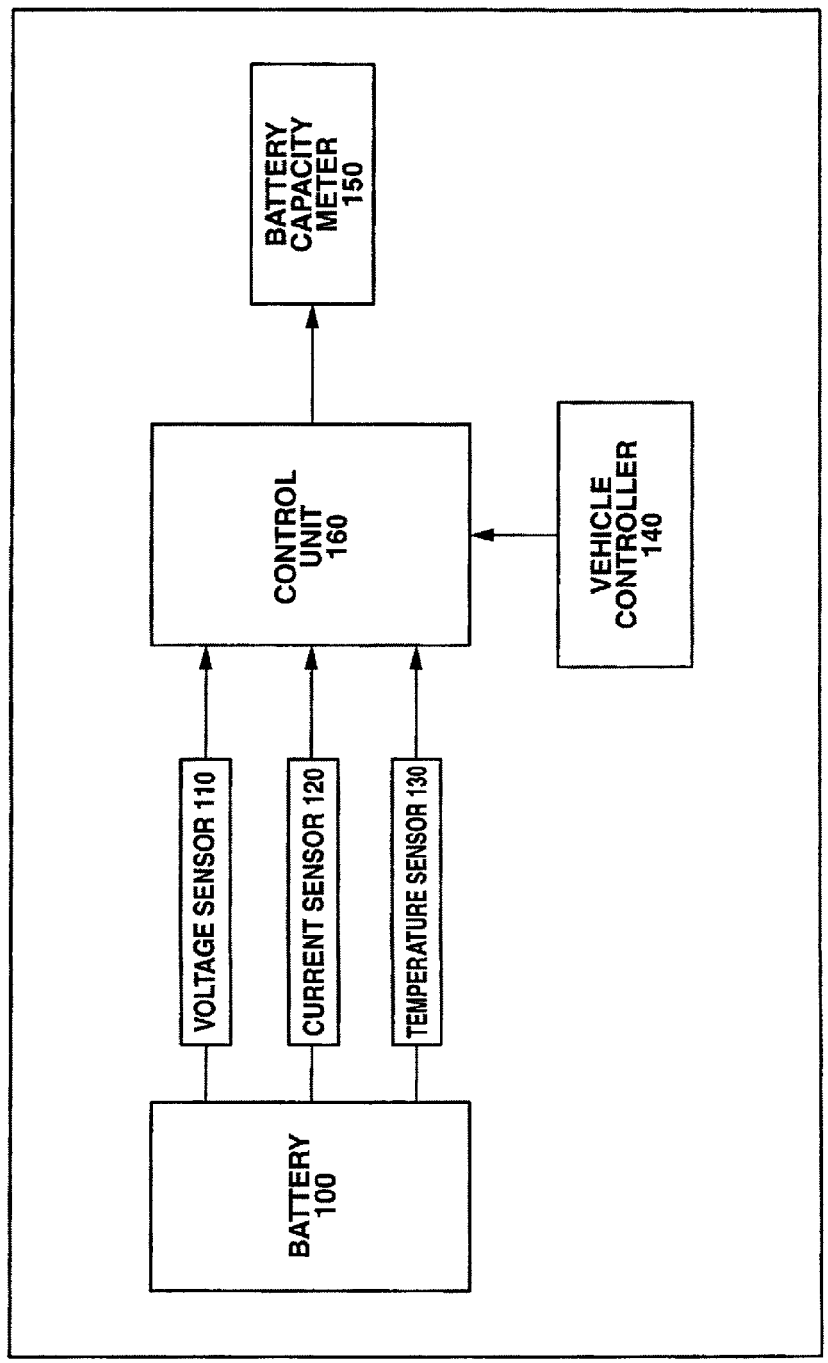
FIG. 1 is a schematic view showing a battery capacity display apparatus according to one embodiment of the present invention.

FIG. 1 is a view showing a configuration of a battery capacity display apparatus according to this embodiment of the present invention. The battery capacity display apparatus according to this embodiment displays, in a battery capacity meter 150, a full charge capacity F of a battery 100 which is indicative of a full charge capacity in a full charge state of battery 100, and a residual capacity R of battery 100 which is indicative of the charge capacity at the present time, so as to show full charge capacity F and residual capacity R to the user. As shown in FIG. 1, the battery capacity display apparatus includes battery 100, a voltage sensor 110, a current sensor 120, a temperature sensor 130, a vehicle controller 140, a battery capacity meter 150, and a control unit 160.

Battery 100 is constituted by a plurality of cells (electric cells) which are secondary battery. For example, each of the cells is constituted by a lead (acid) battery, a lithiumion battery, a nickel hydride battery, and so on. Moreover, battery 100 is connected with voltage sensor 110 and current sensor 120. Temperature sensor 130 is disposed near battery 100. Voltage sensor 110 is configured to sense a terminal voltage of battery 100, and to output the sensed terminal voltage of battery 100 to control unit 160. Furthermore, current sensor 120 is configured to sense a charge/discharge current value of battery 100, and to output the sensed charge/discharge current value of battery 100 to control unit 160. Moreover, temperature sensor 130 is configured to sense a temperature of battery 100, and to output the sensed temperature of battery 100 to control unit 160.

Vehicle controller 140 is configured to obtain (receive) various information relating to the charge/discharge of battery 100, such as a power consumption (electricity power consumption) and a regenerative electric energy by a motor, and a connection state with an external power source. The various information obtained by vehicle controller 140 are outputted to control unit 160.

Control unit 160 is configured to calculate a full charge capacity display value $F_{disp}$ indicative of a full charge capacity F of battery 100, and a residual capacity display value $R_{disp}$ indicative of residual capacity R of battery 100. Moreover, in this embodiment, control unit 160 is configured to correct full charge capacity display value $F_{disp}$ as necessary. Control unit 160 includes a ROM (Read Only Memory) storing a program to calculate and correct full charge capacity display value $F_{disp}$ and residual capacity display value $R_{disp}$, a CPU (Central Processing Unit) which serves an operation circuit to carry out (execute) the stored program in the ROM, and a RAM (Random Access Memory) which serves as an accessible storage device. In place of the CPU or together with the CPU, an MPU (Micro Processing Unit), a DSP (Digital Signal Processor), an ASIC (Application Specific Integrated Circuit), an FPGA (Field Programmable Gate Array), and so on can be used as the operation circuit.

Figure 2:
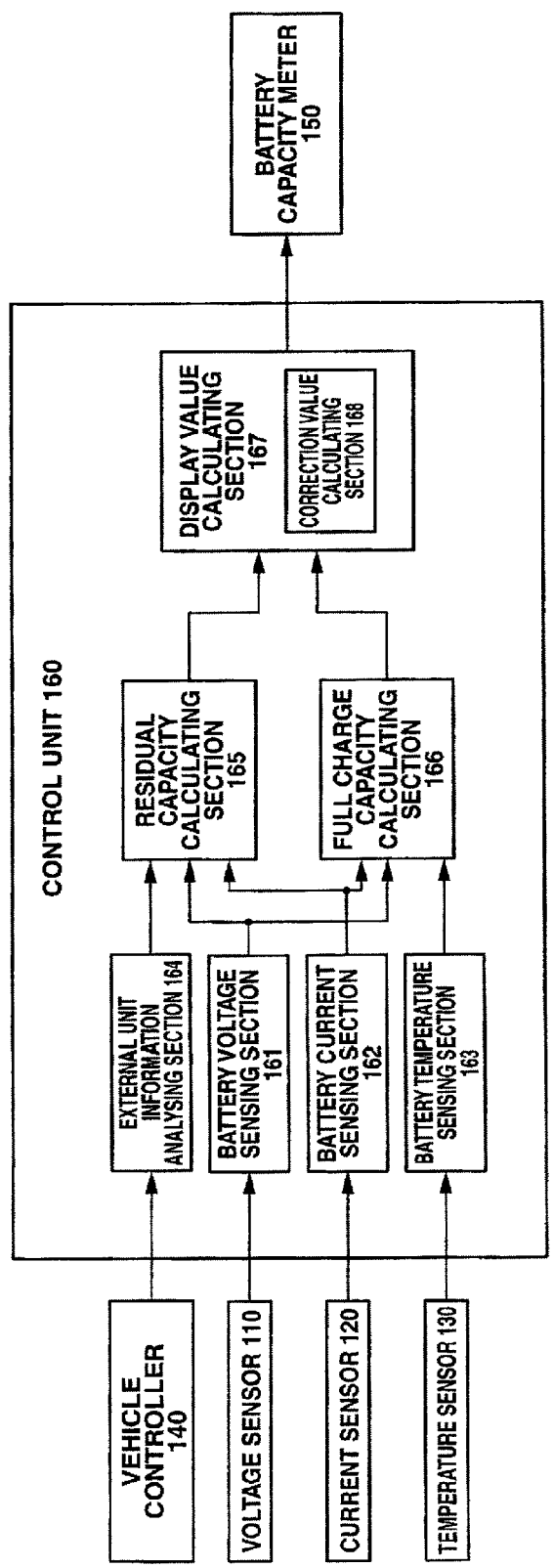
FIG. 2 is a block diagram showing the battery capacity display apparatus of FIG. 1.

FIG. 2 is a block diagram showing the battery capacity display apparatus according to this embodiment. As shown in FIG. 2, control unit 160 includes a battery voltage sensing section 161, a battery current sensing section 162, a battery temperature sensing section 163, an external unit information analyzing section 164, a residual capacity calculating section 165, a full charge capacity calculating section 166, and a display value calculating section 167.

Battery voltage sensing section 161 is configured to obtain (receive) the terminal voltage of battery 100 from voltage sensor 110. The terminal voltage of battery 100 which is obtained by battery voltage sensing section 161 is outputted to residual capacity calculating section 165 and full charge capacity calculating section 166.

Battery current sensing section 162 is configured to obtain (receive) the charge/discharge current value of battery 100 from current sensor 120. The charge/discharge current value of battery 100 which is obtained by battery current sensing section 162 is outputted to residual capacity calculating section 165 and full charge capacity calculating section 166.

Battery temperature sensing section 163 is configured to obtain (receive) the temperature of battery 100 from temperature sensor 130. The temperature of battery 100 which is obtained by battery temperature sensing section 163 is outputted to full charge capacity calculating section 166.

External unit information analyzing section 164 is configured to obtain (receive) the various information such as the regenerative electric energy and the energy consumption of battery 100, from vehicle controller 140, as necessary. The various information obtained by external unit information analyzing section 164 is outputted to residual capacity calculating section 165.

Residual capacity calculating section 165 is configured to obtain the terminal voltage of battery 100 which is obtained by battery voltage sensing section 161, the charge/discharge current value of battery 100 which is obtained by battery current sensing section 162, and the various information such as the regenerative electric energy and the energy consumption of battery 100, and the connection state with the external power supply, which is obtained by external unit information analyzing section 164. Residual capacity calculating section 165 is configured to calculate residual capacity R (Kwh) of battery 100 based on the terminal voltage of battery 100, the charge/discharge current value of battery 100, and the various information. The calculation method of residual capacity R of battery 100 by residual capacity calculating section 165 is not limited to a particular method. For example, the charge/discharge current values are integrated (totaled up), and residual capacity R of battery 100 can be calculated based on the integrated value of the charge/discharge current value and the terminal voltage of battery 100. Moreover, residual capacity calculating section 165 may be configured to calculate residual capacity R of battery 100 by using a table of relationship between the terminal voltage of battery 100 and residual capacity of battery 100. Alternatively, residual capacity calculating section 165 may be configured to calculate residual capacity R of battery 100 based on the various information such as the regenerative electric energy and the energy consumption of battery 100, and the connection state with the external power supply. Furthermore, residual capacity calculating section 165 may be configured to calculate residual capacity R of battery 100 by combining the above-described calculating methods of residual capacity R of battery 100.

Moreover, when residual capacity calculating section 165 calculates residual capacity R of battery 100, residual capacity R may be calculated by multiplying the full charge capacity (Kwh) calculated by full charge capacity calculating section 166 described later by SOC (Wh). When the SOC (Wh) is calculated, SOC (Ah) is calculated based on a correlation map between an open voltage (open-circuit voltage) of battery 100 and the SOC (Ah), and the integrated value of the charge/discharge current, and then the SOC (Wh) can be calculated based on the calculated SOC (Ah), and a correlation data between the SOC (Wh) and the SOC based (Ah).

Full charge capacity calculating section 166 is configured to obtain the terminal voltage of battery 100 which is obtained by battery voltage sensing section 161, the charge/discharge current value of battery 100 which is obtained by battery current sensing section 162, and the temperature of battery 100 which is obtained by battery temperature sensing section 163. Full charge capacity calculating section 166 is configured to calculate full charge capacity F of battery 100 based on the terminal voltage of battery 100, the charge/discharge current value of battery 100, and the temperature of battery 100. The calculating method of full charge capacity F of battery 100 by full charge capacity calculating section 166 is not limited to a particular method. For example, full charge capacity calculating section 166 is configured to calculate full charge capacity F (Kwh) of battery 100 by multiplying, by a deterioration factor, the full charge capacity of a new battery (battery which is not deteriorated) which is previously stored in the ROM of control unit 160. In this case, for example, the deterioration factor can be calculated by a deterioration degree calculated by an internal resistance value and usage history of battery 100, and the temperature of battery 100.

Display value calculating section 167 is configured to calculate full charge capacity display value $F_{disp}$ and residual capacity display value $R_{disp}$ based on residual capacity R of battery 100 which is calculated by residual capacity calculating section 165, and full charge capacity F of battery 100 which is calculated by full charge capacity calculating section 166. Moreover, as shown in FIG. 2, display value calculating section 167 includes a correction value calculating section 168. Display value calculating section 167 is configured to correct full charge capacity display value $F_{disp}$ by using a correction value k calculated by this correction value calculating section 168. Full charge capacity display value $F_{disp}$ and residual capacity display value $R_{disp}$ which are calculated by display value calculating section 167 (including full charge capacity display value $F_{disp}$ corrected by display value calculating section 167) are outputted to battery capacity meter 150, and displayed in battery capacity meter 150. The calculation method of full charge capacity display value $F_{disp}$ and residual capacity display value $R_{disp}$ by display value calculating section 167, and the correction method of full charge capacity display value $F_{disp}$ are illustrated later.

Figure 3:
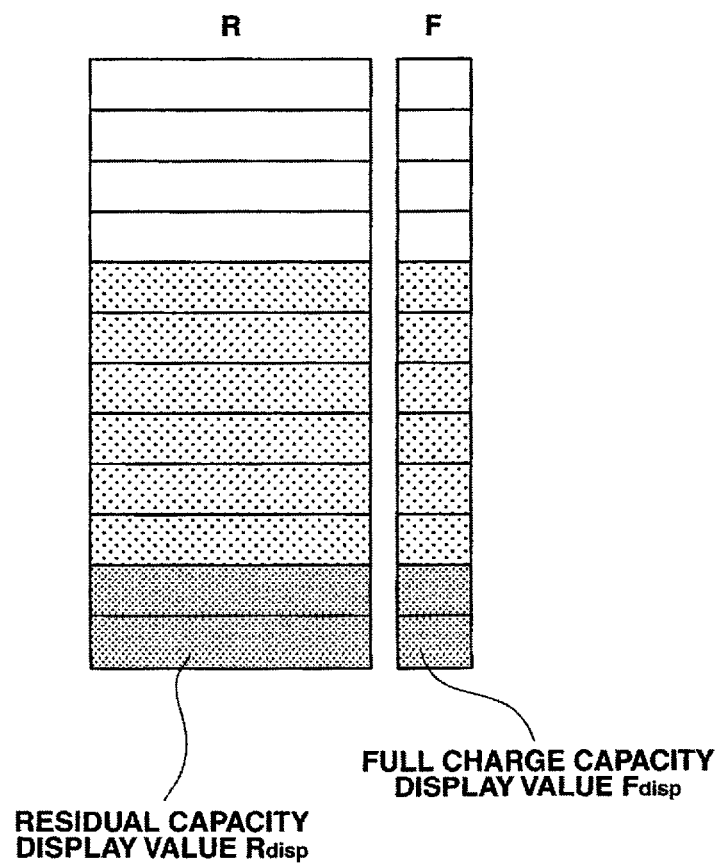
FIG. 3 is a view showing one example of a full charge capacity display value $F_{disp}$ and a residual capacity display value $R_{disp}$ which are displayed in a battery capacity meter.

Battery capacity meter 150 is configured to obtain full charge capacity display value $F_{disp}$ and residual capacity display value $R_{disp}$ from control unit 160, and to display the obtained full charge capacity display value $F_{disp}$ and the obtained residual capacity display value $R_{disp}$. FIG. 3 is one example showing a display (method) of full charge capacity display value $F_{disp}$ and residual capacity display value $R_{disp}$ by battery capacity meter 150. In battery capacity meter 150, residual capacity display value $R_{disp}$ and full charge capacity display value $F_{disp}$ are displayed side by side, as shown in FIG. 3. In particular, battery capacity meter 150 includes two liquid crystal segment sets each of which includes twelve liquid crystal segments, and each of which corresponds to residual capacity display value $R_{disp}$ and full charge capacity display value $F_{disp}$ for displaying residual capacity display value $R_{disp}$ and full charge capacity display value $F_{disp}$, as shown in FIG. 3. Battery capacity meter 150 lights the liquid crystal segments corresponding to residual capacity display value $R_{disp}$ and full charge capacity display value $F_{disp}$ of battery 100 in accordance with the magnitudes of residual capacity display value $R_{disp}$ and full charge capacity display value $F_{disp}$ of battery 100, so as to display residual capacity display value $R_{disp}$ and full charge capacity display value $F_{disp}$ of battery 100. In this embodiment, the crystal segments are used. However, the present invention is applicable to an analogue or digital meter.

Figure 4:
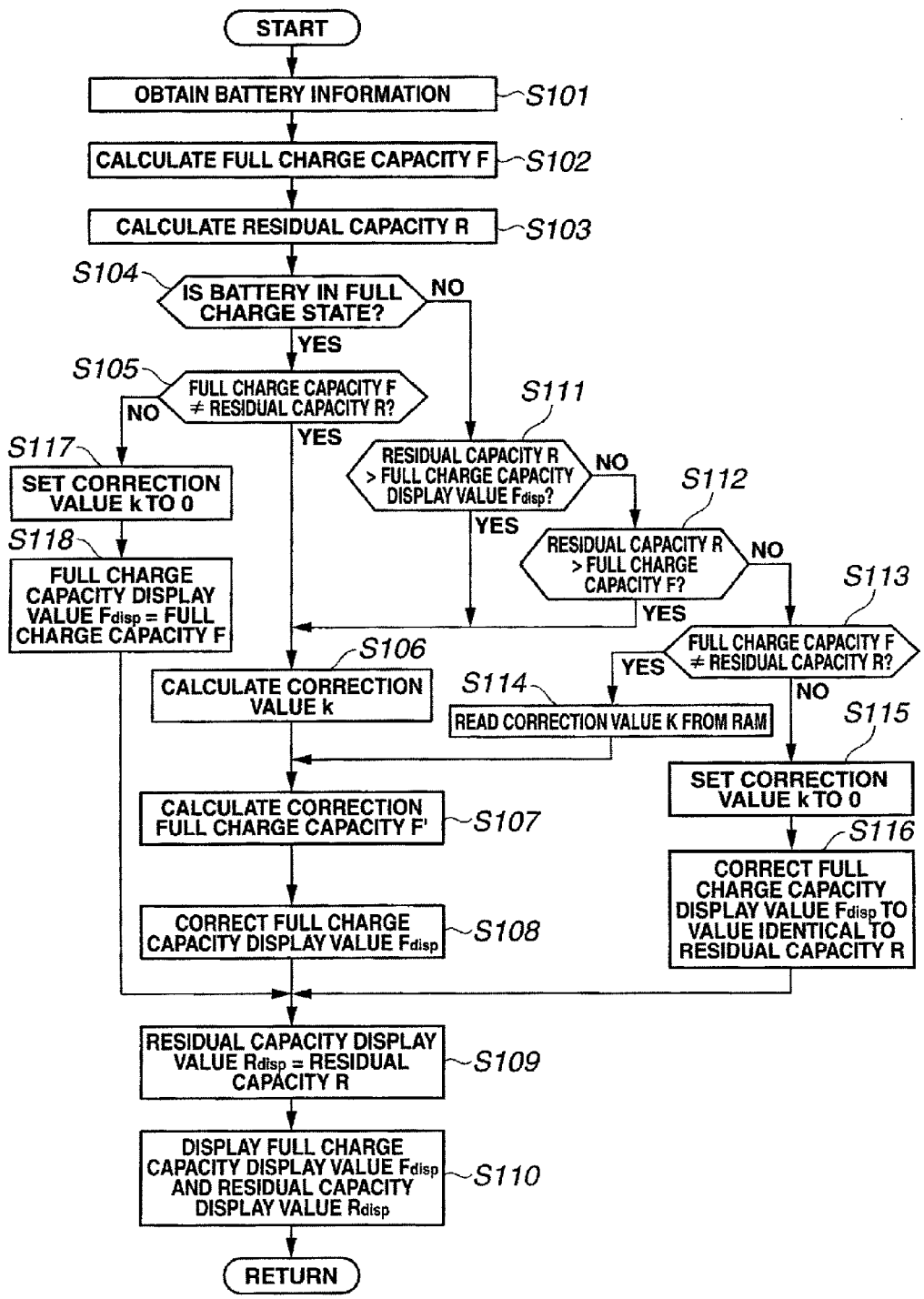
FIG. 4 is a flowchart showing a battery capacity display operation according to the one embodiment of the present invention.

Next, the battery capacity display operation according to this embodiment is illustrated with reference to FIG. 4. FIG. 4 is a flowchart showing the battery capacity display operation according to this embodiment. This battery capacity display operation is performed by the battery capacity display apparatus at an arbitrary timing, or at an regular time interval.

At step S101, control unit 160 obtains the various battery information including the terminal voltage and the charge/discharge current value of battery 100, the temperature of battery 100, the regenerative electric energy and the energy consumption of battery 100, and the connection state with the external power supply. Specifically, the terminal voltage of battery 100 which is sensed by voltage sensor 110 is obtained by battery voltage sensing section 161. The charge/discharge current value of battery 100 which is sensed by current sensor 120 is obtained by battery current sensing section 162. The temperature of battery 100 which is sensed by temperature sensor 130 is obtained by battery temperature sensing section 163. The various information such as the regenerative electric energy, the energy consumption, and the connection state with the external power supply, which is obtained by vehicle controller 140 is obtained by external unit information analyzing section 164.

At step S102, full charge capacity calculating section 166 of control unit 160 calculates full charge capacity F of battery 100 based on the terminal voltage, the charge/discharge current value of battery 100, and the temperature of battery 100 which are obtained at step S101. At step S103, residual capacity calculating section 165 of control unit 160 calculates residual capacity R of battery 100 based on the terminal voltage, the charge/discharge current value of battery 100, and the various information such as the regenerative electric energy and the energy consumption of battery 100, and the connection state with the external power supply, which are obtained at step S101.

At step S104, display value calculating section 167 of control unit 160 judges whether or not battery 100 is in the full charge state. The judging method of the full charge state of battery 100 is not limited to a particular method For example, it is judged whether or not the terminal voltage of battery 100 reaches a predetermined full charge voltage. When the terminal voltage of battery 100 reaches the predetermined full charge voltage, it is judged that battery 100 is in the full charge state. When display value calculating section 167 judges (determines) that battery 100 is in the full charge state (when the answer of step S104 is affirmative (YES)), the process proceeds to step S105. On the other hand, when display value calculating section 167 judges that battery 100 is not in the full charge state (when the answer of step S104 is negative (NO)), the process proceeds to step S111.

At step S105, display value calculating section 167 compares full charge capacity F of battery 100 which is calculated at step S102, and residual capacity R of battery 100 which is calculated at step S103, and judges whether or not full charge capacity F and residual capacity R of battery 100 are different from each other. When display value calculating section 167 judges that full charge capacity F and residual capacity R of battery 100 are different from each other (When the answer of step S105 is affirmative (YES)), the process proceeds to step S106. On the other hand, when display value calculating section 167 judges that full charge capacity F and residual capacity R of battery 100 are identical to each other (When the answer of step S105 is negative (NO)), the process proceeds to step S117.

When it is judged that full charge capacity F and residual capacity R of battery 100 are different from each other at step S105, correction value calculating section 168 calculates correction value k for correcting full charge capacity display value $F_{disp}$ at step S106, based on full charge capacity F of battery 100 which is calculated at step S102, and residual capacity R of battery 100 which is calculated at step S103. Specifically, correction value k is calculated by a difference between full charge capacity F and residual capacity R of battery 100, as shown in a following equation (1).

$$\text{correction value } k = \text{full charge capacity } F - \text{residual capacity } R \quad (1)$$

Subsequently to step S106, at step S107, display value calculating section 167 calculates a correction full charge capacity F' based on full charge capacity F of battery 100 which is calculated at step S102, and correction value k which is calculated at step S106. Specifically, correction full charge capacity F' is calculated by subtracting correction value k from full charge capacity F of battery 100, as shown in a following equation (2).

$$\text{correction full charge capacity } F' = \text{full charge capacity } F - \text{correction value } k \quad (2)$$

Subsequently to step S107, display value calculating section 167 corrects full charge capacity display value $F_{disp}$. Specifically, full charge capacity display value $F_{disp}$ is corrected to correction full charge capacity F' calculated at step S107, as shown in a following equation (3).

$$\text{full charge capacity display value } F_{disp} = \text{correction full charge capacity } F' \quad (3)$$

This full charge capacity display value $F_{disp}$ calculated by display value calculating section 167 and also residual capacity display value $R_{disp}$ set at step S109 described later are outputted to battery capacity meter 150. Moreover, in this embodiment, correction value k calculated at step S106 is stored in the RAM of control unit 160 by display value calculating section 167. Correction value k stored in the RAM is used at step S114 described later.

At step S109, display value calculating section 167 sets residual capacity R calculated at step S103 to residual capacity display value $R_{disp}$. This residual capacity display value $R_{disp}$ and also full charge capacity display value $F_{disp}$ are outputted to battery capacity meter 150.

At step S110, battery capacity meter 150 obtains full charge capacity display value $F_{disp}$ corrected at step S108, and residual capacity display value $R_{disp}$ set at step S109. For example, battery capacity meter 150 displays the obtained full charge capacity display value $F_{disp}$ and residual capacity display value $R_{disp}$, as shown in FIG. 3. After battery capacity meter 150 displays full charge capacity display value $F_{disp}$ and residual capacity display value $R_{disp}$, the process returns to step S101 to repeat this battery capacity display operation.

On the other hand, when it is judged that battery 100 is not in the full charge state (when the answer of step S104 is negative (NO)) at step S104, the process proceeds to step S111. At step S111, display value calculating section 167 judges whether or not residual capacity R of battery 100 which is calculated at step S103 is greater than full charge capacity display value $F_{disp}$ displayed at the present time (residual capacity R>full charge capacity display value $F_{disp}$). When it is judged that residual capacity R of battery 100 is greater than full charge capacity display value $F_{disp}$ displayed at the present time (when the answer of step S111 is affirmative (YES)), the process proceeds to step S106 so as to correct full charge capacity display value $F_{disp}$ displayed at the present time. The correction value k is calculated again (step S106). Full charge capacity display value $F_{disp}$ is corrected by using this correction value k (step S107 and S108). Then, the corrected full charge capacity display value $F_{disp}$ and also residual capacity display value $R_{disp}$ are displayed (step S110). On the other hand, when it is judged that residual capacity R of battery 100 is equal to or smaller than full charge capacity display value $F_{disp}$ displayed at the present time (when the answer of step S111 is negative (NO)), the process proceeds to step S112.

At step S112, display value calculating section 167 judges whether or not residual capacity R of battery 100 which is calculated at step S103 is greater than full charge capacity F of battery 100 which is calculated at step S102 (residual capacity R>full charge capacity F). When it is judged that residual capacity R of battery 100 is greater than full charge capacity F of battery 100 (when the answer of step S112 is affirmative (YES)), the process proceeds to step S106 so as to correct full charge capacity display value $F_{disp}$. The correction value k is calculated again (step S106). Full charge capacity display value $F_{disp}$ is corrected by using this correction value k (step S107 and S108). The corrected full charge capacity display value $F_{disp}$ and also residual capacity display value $R_{disp}$ are displayed (step S110). On the other hand, when it is judged that residual capacity R of battery 100 is equal to or smaller than full charge capacity F of battery 100 (when the answer of step S112 is negative (NO)), the process proceeds to step S113.

At step S113, it is judged whether or not residual capacity R and full charge capacity F of battery 100 are different from each other. When it is judged that residual capacity R and full charge capacity F of battery 100 are different from each other (When the answer of step S113 is affirmative (YES)), the process proceeds to step S114. On the other hand, when it is judged that residual capacity R and full charge capacity F of battery 100 are identical to each other at step S113 (step S113=NO), the process proceeds to step S115. At step S115, correction value k stored in the RAM is renewed to zero. Then, at step S116, full charge capacity display value $F_{disp}$ is corrected to a value identical to residual capacity R. Subsequently to step S116, residual capacity display value $R_{disp}$ is set at step S109. Battery capacity meter 150 displays full charge capacity display value $F_{disp}$ corrected at step S116 and also residual capacity display value $R_{disp}$ (step S110).

On the other hand, when it is judged that residual capacity R and full charge capacity F of battery 100 are different from each other at step S113 (when the answer of step S113 is affirmative (YES)), the process proceeds to step S114. At step S114, display value calculating section 167 reads correction value k stored in the RAM of control unit 160. After correction value k is read at step S114, the process proceeds to step S107, and the correction full charge capacity F' is calculated by using correction value k read at step S114 (step S107). Full charge capacity display value $F_{disp}$ is corrected to correction full charge capacity F' (step S108). The corrected full charge capacity display value $F_{disp}$ and also residual capacity display value $R_{disp}$ are displayed (step S110). In this case, correction value k is the value which is calculated at step S106 of the previous process, and which is stored in the RAM of control unit 160, or the value which is renewed to zero at step S115 or S117 of the previous process, and which is stored in the RAM of control unit 160. That is, the correction operation of full charge capacity display value $F_{disp}$ after step S114 uses correction value k which is calculated at step S106 of the previous process, or correction value k which is renewed at step S115 or S117 of the previous process. In this case, when correction value k is not set at step S106 or steps S115 and S117, "zero" is used as correction value k.

On the other hand, when it is judged that full charge capacity F and residual capacity R of battery 100 are identical to each other at step S105 (when the answer of step S105 is negative (NO)), the process proceeds to step S117. At step S117, correction value k is renewed to zero. Subsequently to step S117, full charge capacity display value $F_{disp}$ is set to a value identical to full charge capacity F at step S118. After full charge capacity display value $F_{disp}$ is set at step S118, the process proceeds to step S109. Residual capacity display value $R_{disp}$ is set (step S109). Then, full charge capacity display value $F_{disp}$ and also residual capacity display value $R_{disp}$ are displayed (step S110).

As described above, the battery capacity display operation is performed.

Figure 5:
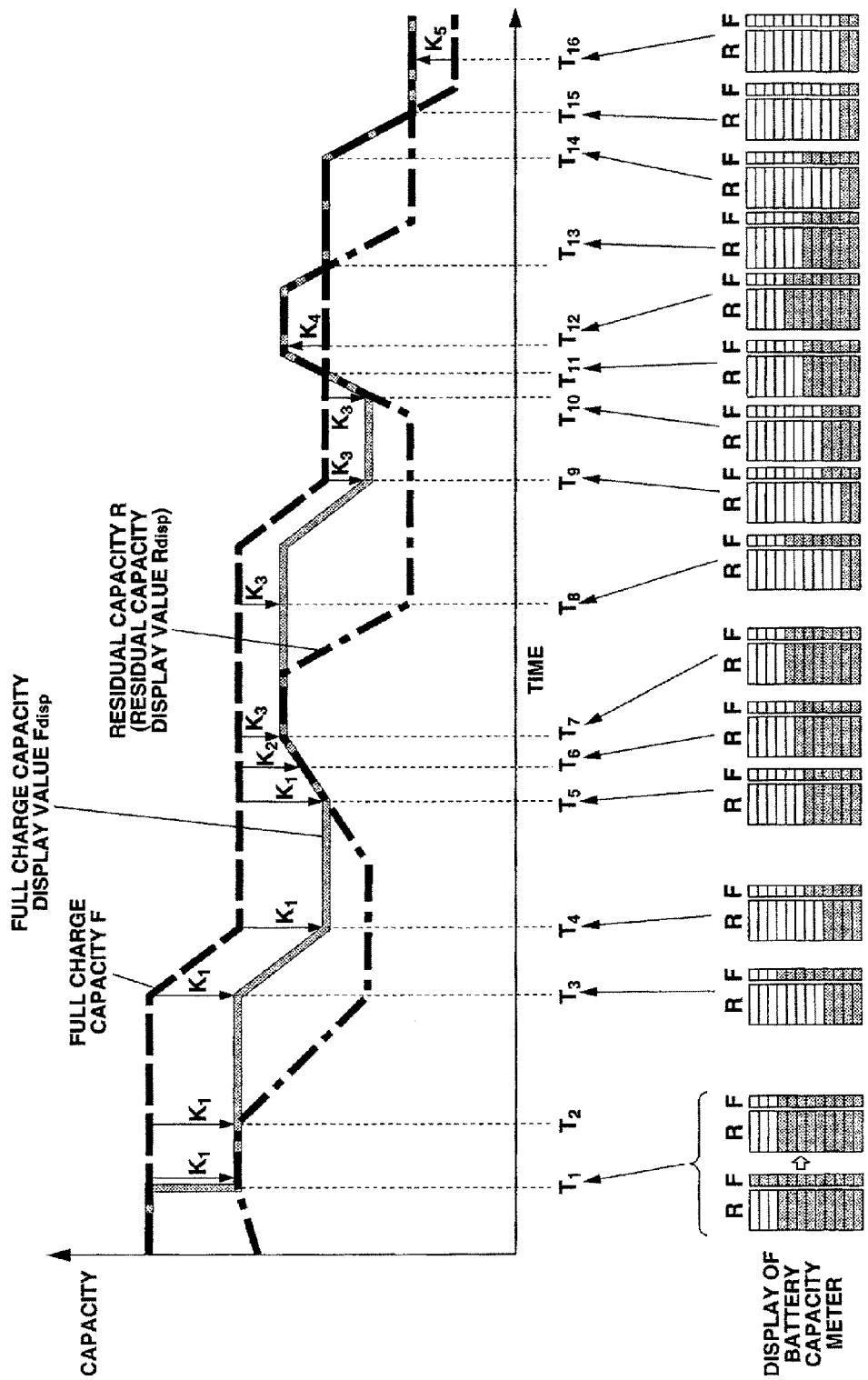
FIG. 5 is an illustrative view showing the battery capacity display operation according to the one embodiment of the present invention.

Next, the battery capacity display operation is illustrated with reference to FIG. 5. FIG. 5 shows one example of a transition of full charge capacity F, full charge capacity display value $F_{disp}$, and residual capacity R (residual capacity display value $R_{disp}$), and displays of battery capacity meter 150. In the graph of FIG. 5, a vertical axis represents magnitudes of full charge capacity F, full charge capacity display value $F_{disp}$, and residual capacity R (residual capacity display value $R_{disp}$) of the battery, and a horizontal axis represents a time. Moreover, "displays of the battery capacity meter" are exemplified in a lower portion of FIG. 5. This "display of the battery capacity meter" shows a display of battery capacity meter 150 at a corresponding time. Hereinafter, the full charge capacity, the correction full charge capacity, the full charge capacity display value, the residual capacity, and the residual capacity display value at a time $T_1$ are represented, respectively, as a full charge capacity F(1), a correction full charge capacity F'(1), a full charge capacity display value $F_{disp}(1)$, a residual capacity R(1), and a residual capacity display value $R_{disp}(1)$. Similarly, the full charge capacity, the correction full charge capacity, the full charge capacity display value, the residual capacity, and the residual capacity display value at a time $T_2$ are represented, respectively, as a full charge capacity F(2), a correction full charge capacity F'(2), a full charge capacity display value $F_{disp}(2)$, a residual capacity R(2), and a residual capacity display value R(2). Furthermore, the full charge capacity, the correction full charge capacity, the full charge capacity display value, the residual capacity, and the residual capacity display value at each of times $T_3$-$T_{16}$ are represented by a similar manner.

At time $T_1$ shown in FIG. 5, battery 100 is in the full charge state (step S104=YES). Accordingly, it is judged whether or not full charge capacity F and residual capacity R of battery 100 are different from each other (step S105). In this case, at time $T_1$ at which battery 100 is in the full charge state, full charge capacity F(1) at time $T_1$ and residual capacity R(1) at time $T_1$ are different from each other (step S105=YES), as shown in FIG. 5. Therefore, correction value $k_1$ is calculated based on the following equation (4) (step S106).

correction value $k_1$=full charge capacity $F(1)$−residual capacity $R(1)$ (4)

Moreover, full charge capacity display value $F_{disp}$ at time $T_1$ is corrected based on the following equations (5) and (6) by using the calculated correction value $k_1$ (step S107 and step S108).

correction full charge capacity $F'(1)$=full charge capacity $F(1)$−correction value $k_1$ (5)

full charge capacity display value $F_{disp}(1)$=correction full charge capacity $F'(1)$ (6)

In this case, correction value $k_1$ calculated at time $T_1$ is stored in the RAM of control unit 160.

Then, full charge capacity display value $F_{disp}(1)$ corrected at time $T_1$ and residual capacity display value $R_{disp}(1)$ which is the value of residual capacity R(1) are displayed in battery capacity meter 150 (step S110). In this case, as "the display of the battery capacity meter" corresponding to time $T_1$, FIG. 5 exemplifies the display (on a left side of FIG. 5) of battery capacity meter 150 before full charge capacity display value $F_{disp}$ is corrected at time $T_1$, and the display (on a right side of FIG. 5) of battery capacity meter 150 after full charge capacity display value $F_{disp}$ has been corrected. In this way, full charge capacity display value $F_{disp}$ and residual capacity display value $R_{disp}$ are displayed by (as) the different values before full charge capacity display value $F_{disp}$ is corrected at time $T_1$, like the display (on the left side) of battery capacity meter 150 before full charge capacity display value $F_{disp}$ is corrected. On the other hand, when full charge capacity display value $F_{disp}$ is corrected at time $T_1$ at which battery 100 is in the full charge state, full charge capacity display value $F_{disp}(1)$ and residual capacity display value $R_{disp}(1)$ are displayed by the identical (same) value, like the display (on the right side) of battery capacity meter 150 after full charge capacity display value $F_{disp}$ has been corrected (step S110).

From time $T_1$ to time $T_2$, residual capacity R and full charge capacity F of battery 100 are not varied from the value at time $T_1$. Accordingly, for example, at time $T_2$ shown in FIG. 5, battery 100 is in the full charge state (step S104=YES). Moreover, full charge capacity F(2) at time $T_2$ and residual capacity R(2) at time $T_2$ are different from each other (step S105=YES). Therefore, correction value $k_1$ is calculated at time $T_2$ based on full charge capacity F(2) and residual capacity R(2) (step S106), like time $T_1$. Full charge capacity display value $F_{disp}(2)$ at time $T_2$ is corrected by using the calculated correction value $k_1$ (step S107 and step S108). Consequently, full charge capacity display value $F_{disp}(2)$ and residual capacity display value $R_{disp}(2)$ are displayed at time $T_2$ (step S110), like the display (the right side) of battery capacity meter 150 after full charge capacity display value $F_{disp}$ has been corrected at time $T_1$. Correction value k calculated at time $T_2$ is also stored in the RAM of control unit 160.

From time $T_2$ to time $T_3$, battery 100 is discharged. Accordingly, residual capacity R of battery 100 is decreased.

In this case, battery 100 is not in the full charge state from time $T_2$ to time $T_3$ (step S104=NO). Residual capacity R of battery 100 is not greater than full charge capacity display value or full charge capacity F (step S111=NO, step S112=NO). Moreover, full charge capacity F and residual capacity R of battery 100 are different from each other (step S113=YES). Therefore, correction value $k_1$ calculated at time $T_2$ is read (step S114). Full charge capacity display value $F_{disp}$ is calculated by using this correction value $k_1$ (steps S107 and S108). For example, full charge capacity display value $F_{disp}(3)$ at time $T_3$ is corrected by using correction value $k_1$ calculated at time $T_2$, based on the following equations (7) and (8) (steps S107 and S108).

$$\text{correction full charge capacity } F'(3) = \text{full charge capacity } F(3) - \text{correction value } k_1 \quad (7)$$

$$\text{full charge capacity display value } F_{disp}(3) = \text{correction full charge capacity } F'(3) \quad (8)$$

In this way, from time $T_2$ to time $T_3$, full charge capacity F of battery 100 and correction value $k_1$ are not varied. The only residual capacity R of battery 100 is decreased. Accordingly, when the display of battery capacity meter 150 at time $T_3$ and the display (on the right side) of battery capacity meter 150 after full charge capacity display value $F_{disp}$ has been corrected at time $T_1$ are compared, residual capacity display value $R_{disp}(3)$ is displayed by a value decreased by a discharge amount of battery 100 (step S110).

Moreover, from time $T_3$ to time $T_4$, full charge capacity F of battery 100 is decreased due to the temperature variation and the deterioration of battery 100. In this case, like from time $T_2$ to time $T_3$, battery 100 is not in the full charge state (step S104=NO), and residual capacity R of battery 100 is not greater than full charge capacity display value $F_{disp}$ or full charge capacity F (step S111=NO, step S112=NO). Furthermore, full charge capacity F and residual capacity R of battery 100 are different from each other (step S113=YES). Accordingly, correction value $k_1$ calculated at time $T_2$ is read (step S114). Full charge capacity display value $F_{disp}$ is calculated by using this correction value $k_1$ (steps S107 and S108). From time $T_3$ to time $T_4$, full charge capacity F of battery 100 is decreased. Consequently, when the display of battery capacity meter 150 at time $T_4$ and the display of battery capacity meter 150 at time $T_3$ are compared, full charge capacity display value $F_{disp}(4)$ is displayed by a value decreased by a decreased amount of full charge capacity of battery 100.

Moreover, from time $T_4$ to time $T_5$, battery 100 is charged. Residual capacity R of battery 100 is increased. From time $T_4$ to time $T_5$, residual capacity R of battery 100 is not greater than full charge capacity display value $F_{disp}$ or full charge capacity F (step S111=NO, step S112=NO), like from time $T_2$ to time $T_3$, and from time $T_3$ to time $T_4$. Furthermore, full charge capacity F and residual capacity R of battery 100 are different from each other (step S113=YES). Accordingly, correction value $k_1$ calculated at time $T_2$ is read (step S114). Full charge capacity display value $F_{disp}$ is calculated by using this correction value $k_1$ (steps S107 and S108). Therefore, when the display of battery capacity meter 150 at time $T_5$ and the display of battery capacity meter 150 at time $T_4$ are compared, residual capacity display value $R_{disp}$ is displayed by a value increased by the amount by the charge of battery 100.

From time $T_5$ to time $T_7$, battery 100 is charged continuously from time $T_4$ to time $T_5$. Residual capacity R of battery 100 is increased. In particular, from time $T_5$ to time $T_7$, residual capacity R of battery 100 is increased, so that residual capacity R of battery 100 is greater than full charge capacity display value $F_{disp}$ displayed at the present time, that is, full charge capacity display value $F_{disp}$ corrected at the previous process (step S111=YES). Therefore, from time $T_5$ to time $T_7$, correction value k is calculated again based on full charge capacity F and residual capacity R of battery 100 (step S106). Full charge capacity display value $F_{disp}$ is corrected by using the calculated correction value k (steps S107 and S108).

For example, at time $T_6$, correction value k2 is calculated based on full charge capacity F(6) at time $T_6$ and residual capacity R(6) at time $T_6$ as shown in the following equations (9)-(11) (step S106). Full charge capacity display value $F_{disp}(6)$ is calculated by using this correction value k2 (steps S107 and S108).

$$\text{correction value } k2 = \text{full charge capacity } F(6) - \text{residual capacity } R(6) \quad (9)$$

$$\text{correction full charge capacity } F'(6) = \text{full charge capacity } F(6) - \text{correction value } k2 \quad (10)$$

$$\text{full charge capacity display value } F_{disp}(6) = \text{correction full charge capacity } F'(6) \quad (11)$$

Similarly, at time $T_7$, correction value $k_3$ is calculated (step S106). Full charge capacity display value $F_{disp}(7)$ at time $T_7$ is corrected by using this correction value $k_3$ (steps S107 and S108). In this way, from time $T_5$ to time $T_7$, full charge capacity display value $F_{disp}$ is corrected to be identical to residual capacity R of battery 100. Accordingly, full charge capacity display value $F_{disp}$ is displayed by a value identical to residual capacity display value $R_{disp}$ (step S110).

Moreover, from time $T_7$ to time $T_8$, from time $T_8$ to time $T_9$, and from time $T_9$ to time $T_{10}$, battery 100 is not in the full charge state (step S104=NO), respectively like from time $T_2$ to time $T_3$, from time $T_3$ to time $T_4$, and from time $T_4$ to time $T_5$. Furthermore, residual capacity R of battery 100 is not greater than full charge capacity display value $F_{disp}$ or full charge capacity F (step S111=NO, step S112=NO). Moreover, full charge capacity F and residual capacity R of battery 100 are different from each other (step S113=YES). Therefore, correction value $k_3$ calculated at time $T_7$ is read from the RAM of control unit 160 (step S114). Full charge capacity display value $F_{disp}$ is calculated by using this correction value $k_3$ (steps S107 and S108). Consequently, from time $T_7$ to time $T_8$, from time $T_8$ to time $T_9$, and from time $T_9$ to time $T_{10}$, residual capacity display value $R_{disp}$ is displayed in accordance with residual capacity R of battery 100, and full charge capacity display value $F_{disp}$ is displayed in accordance with full charge capacity F of battery 100 (step S110).

Moreover, from time $T_{10}$ to time $T_{12}$, residual capacity R of battery 100 is greater than full charge capacity display value $F_{disp}$ displayed at the present time, that is, full charge capacity display value $F_{disp}$ corrected at the previous process (step S111=YES), like from time $T_5$ to time $T_7$. Accordingly, correction value k is recalculated (step S106). Full charge capacity display value $F_{disp}$ is corrected based on the calculated correction value k (steps S107 and S108). Consequently, from time $T_{10}$ to time $T_{12}$, full charge capacity display value $F_{disp}$ is corrected to the value identical to the residual capacity R of battery 100, like from time $T_5$ to time $T_7$. Therefore, full charge capacity display value $F_{disp}$ and residual capacity display value $R_{disp}$ are displayed by the same value (step S110).

On the other hand, from time $T_{12}$ to time $T_{13}$, battery 100 is discharged. Residual capacity R of battery 100 is decreased. From time $T_{12}$ to time $T_{13}$, battery 100 is not in the full charge state (step S104=NO). Residual capacity R of battery 100 is not greater than full charge capacity display value $F_{disp}$ displayed at the present time, that is, full charge capacity display value $F_{disp}$ corrected at the previous process (step S111=NO). Accordingly, it is judged whether or not residual capacity R of battery 100 is greater than full charge capacity F (step S112). In this case, from time $T_{12}$ to time $T_{13}$, residual capacity R of battery 100 is greater than full charge capacity F, as shown in FIG. 5. Consequently, it is judged that residual capacity R of battery 100 is greater than full charge capacity F (step S112=YES). Correction value k is recalculated (step S106). Then, full charge capacity display value $F_{disp}$ is calculated by using the calculated correction value k (steps S107 and S108). For example, at time $T_{12}$, as shown in following equations (12)-(14), correction value $k_4$ is calculated (step S106), and full charge capacity display value $F_{disp}$ at time $T_{12}$ is calculated by using the calculated correction value $k_4$ (steps S107 and S108).

correction value $k_4$=full charge capacity $F(12)$-residual capacity $R(12)$ (12)

correction full charge capacity $F'(12)$=full charge capacity $F(12)$-correction value $k_4$ (13)

full charge capacity display value $F_{disp}(12)$=correction full charge capacity $F'(12)$ (14)

In this way, from time $T_{12}$ to time $T_{13}$, full charge capacity display value $F_{disp}$ is corrected to a value identical to residual capacity R of battery 100. Accordingly, full charge capacity display value $F_{disp}$ and residual capacity display value $R_{disp}$ are displayed as the same value (step S110).

Moreover, at time $T_{13}$, battery 100 is not in the full charge state (step S104=NO). Residual capacity R of battery 100 is not greater than full charge capacity display value $F_{disp}$ or full charge capacity F (step S111=NO, step S112=NO). Accordingly, it is judged whether or not full charge capacity F and residual capacity R of battery 100 are different from each other (step S113). At time $T_{13}$, full charge capacity F and residual capacity R of battery 100 are identical to each other (step S113=NO), as shown in FIG. 5. Accordingly, correction value k stored in the RAM of control unit 160 is renewed to zero (step S115), as shown in the following equation (15). Full charge capacity display value $F_{disp}$ at time $T_{13}$ is corrected to the same value as residual capacity R at time $T_{13}$ (step S116).

correction value=0 (15)

full charge capacity display value $F_{disp}(13)$=residual capacity $R(13)$ (16)

Therefore, at time $T_{13}$, full charge capacity display value $F_{disp}$ and residual capacity display value $R_{disp}$ are displayed by the same value (step S110).

Moreover, from time $T_{13}$ to time $T_{14}$, residual capacity R of battery 100 is further decreased due to the discharge of battery 100. In this case, from time $T_{13}$ to time $T_{14}$, battery 100 is not in the full charge state, like from time $T_2$ to time $T_3$, and from time $T_7$ to time $T_8$ (step S104=NO). Moreover, residual capacity R of battery 100 is not greater than full charge capacity display value $F_{disp}$ or full charge capacity F (step S111=NO, step S112=NO). Furthermore, full charge capacity F and residual capacity R of battery 100 are different from each other (step S113=YES). Accordingly, correction value k renewed at time $T_{13}$ is read from the RAM of control unit 160 (step S114). Full charge capacity display value $F_{disp}$ is calculated by using this correction value k (steps S107 and S108). In this case, correction value k renewed at time $T_{13}$ is zero. Therefore, from time $T_{13}$ to time $T_{14}$, full charge capacity display value $F_{disp}$ is displayed by the same value as the full charge capacity F of battery 100 (step S110).

Moreover, from time $T_{14}$ to time $T_{15}$, full charge capacity of battery 100 is in the decreased state due to the temperature variation and the deterioration of battery 100. In this case, from time $T_{14}$ to time $T_{15}$, battery 100 is not in the full charge state (step S104=NO), like from time $T_3$ to time $T_4$, and from time $T_8$ to time $T_9$. Moreover, residual capacity R of battery 100 is not greater than full charge capacity display value $F_{disp}$ or full charge capacity F (step S111=NO, step S112=NO). Furthermore, full charge capacity F and residual capacity R of battery 100 are different from each other (step S113=YES). Therefore, correction value k renewed at time $T_{13}$ is read from the RAM of control unit 160 (step S114). Full charge capacity display value $F_{disp}$ is calculated by using this correction value k (steps S107 and S108). In this case, correction value k renewed at time $T_{13}$ is zero. Accordingly, from time $T_{14}$ to time $T_{15}$, full charge capacity display value $F_{disp}$ is displayed by the same value as full charge capacity F of battery 100 (step S110), like from time $T_{13}$ to time $T_{14}$.

At time $T_{15}$, battery 100 is not in the full charge state (step S104=NO), like time $T_{13}$. Moreover, residual capacity R of battery 100 is not greater than full charge capacity display value $F_{disp}$ or full charge capacity F (step S111=NO, step S112=NO). Moreover, at time $T_{15}$, full charge capacity F and residual capacity R of battery 100 are identical to each other (step S113=NO), like time $T_{13}$. Accordingly, correction value k stored in the RAM of control unit 160 is renewed to zero (step S115). Full charge capacity display value $F_{disp}(15)$ at time $T_{15}$ is corrected to a value identical to residual capacity $R(15)$ at time $T_{15}$ (step S116). Therefore, at time $T_{15}$, full charge capacity display value $F_{disp}$ and residual capacity display value $R_{disp}$ are displayed as the same value (step S110), like time $T_{13}$.

Moreover, from time $T_{15}$ to time $T_{16}$, full charge capacity F of battery 100 is further decreased than the state from time $T_{14}$ to time $T_{15}$. From time $T_{15}$ to time $T_{16}$, battery 100 is not in the full charge state (step S104=NO), like from time $T_{12}$ to time $T_{13}$. Furthermore, residual capacity R of battery 100 is not greater than full charge capacity display value $F_{disp}$ (step S111=NO). Moreover, from time $T_{15}$ to time $T_{16}$, residual capacity R of battery 100 is greater than full charge capacity F of battery 100 (step S112=YES), like from time $T_{12}$ to time $T_{13}$. Therefore, from time $T_{15}$ to time $T_{16}$, correction value k is recalculated (step S106). Full charge capacity display value $F_{disp}$ is corrected by using this calculated correction value k (steps S107 and S108). In this way, from time $T_{15}$ to time $T_{16}$, full charge capacity display value $F_{disp}$ is corrected to a value identical to residual capacity R of battery 100. Accordingly, full charge capacity display value $F_{disp}$ and residual capacity display value $R_{disp}$ are displayed as the same value (step S110).

As mentioned above, in the battery capacity display apparatus according to the embodiment of the present invention, when battery 100 is in the full charge state and full charge capacity F and residual capacity R of battery 100 are different from each other, full charge capacity display value $F_{disp}$ indicative of full charge capacity F of battery 100 is corrected to a value identical to residual capacity display value $R_{disp}$ indicative of residual capacity R of battery 100. The corrected full charge capacity display value $F_{disp}$ and residual capacity display value $R_{disp}$ are displayed. With this, in the battery capacity display apparatus according to this embodiment, even when full charge capacity F and residual capacity R of battery 100 are different from each other in the full charge state of battery 100, full charge capacity display value $F_{disp}$ and residual capacity display value $R_{disp}$ which are displayed to the user are identical to each other. Accordingly, it is possible to display full charge capacity display value $F_{disp}$ and residual capacity display value $R_{disp}$ without causing unnatural feeling (uncomfortable feeling) to the user. In particular, in the conventional apparatus, even in the full charge state of battery 100, full charge capacity F and residual capacity R of battery 100 are displayed so as not to correspond to each other due to operation error (calculation error). Accordingly, this may cause the unnatural feeling to the user. In the battery capacity display apparatus according to the embodiment, even when full charge capacity F and residual capacity R of battery 100 are different from each other in the full charge state of battery 100, full charge capacity display value $F_{disp}$ and residual capacity display value $R_{disp}$ are displayed by the same value. Therefore, it is possible to effectively dissolve the above-described problem.

Moreover, in the battery capacity display apparatus according to the embodiment of the present invention, residual capacity R of battery 100, and full charge capacity display value $F_{disp}$ and/or full charge capacity F are compared when battery 100 is not in the full charge state. When residual capacity R of battery 100 is greater than full charge capacity display value $F_{disp}$ or full charge capacity F, full charge capacity display value $F_{disp}$ is corrected to be identical to residual capacity display value $R_{disp}$. The corrected full charge capacity display value $F_{disp}$ and residual capacity display value $R_{disp}$ are displayed. With this, in the battery capacity display apparatus according to the embodiment of the present invention, even when residual capacity R of battery 100 is greater than full charge capacity display value $F_{disp}$ or full charge capacity F, full charge capacity display value $F_{disp}$ and residual capacity display value $R_{disp}$ which are displayed to the user become the same value. Therefore, it is possible to display full charge capacity display value $F_{disp}$ and residual capacity display value $R_{disp}$, without causing the unnatural feeling to the user.

Furthermore, in the battery capacity display apparatus according to the embodiment of the present invention, the difference between full charge capacity F and residual capacity R is calculated as correction value k for correcting full charge capacity display value $F_{disp}$. This correction value k is stored in the RAM of control unit 160. When full charge capacity display value $F_{disp}$ is corrected at later processes, full charge capacity display value $F_{disp}$ is corrected by using correction value k which is calculated at the previous process, and which is stored in the RAM of control unit 160. With this, when full charge capacity F and residual capacity R of battery 100 are different from each other in the full charge state of battery 100, or when residual capacity R of battery 100 is greater than full charge capacity display value $F_{disp}$ or full charge capacity F, it is possible to appropriately display the corrected full charge capacity display value $F_{disp}$ in accordance with the variation of full charge capacity F at the later steps, and thereby to effectively prevent from causing the unnatural feeling to the user.

In addition, in the battery capacity display apparatus according to the embodiment of the present invention, the only full charge capacity display value $F_{disp}$ is corrected. Residual capacity display value $R_{disp}$ is displayed directly by residual capacity R of battery 100. In this case, residual capacity R of battery 100 is based on the actual data (for example, the terminal voltage and the charge/discharge current value of battery 100, and so on). Accordingly, the measurement accuracy of residual capacity R of battery 100 is greater than the measurement accuracy of full charge capacity F of battery 100. Therefore, it is possible to display more accurate full charge capacity display value $F_{disp}$ and residual capacity display value $R_{disp}$ to the user by correcting full charge capacity display value $F_{disp}$ only.

The above-described embodiment is described for facilitating the understanding of the present invention. The above-described embodiment is not described for limiting the present invention. The elements disclosed in the above-described embodiment includes all design changes and equivalents which belong to art region of the present invention.

In the above-described embodiment, the only full charge capacity display value $F_{disp}$ is corrected. However, the present invention is not limited to the control operation. For example, the only residual capacity display value $R_{disp}$ may be corrected. Both of full charge capacity display value $F_{disp}$ and residual capacity display value $R_{disp}$ may be corrected. Moreover, for example, when full charge capacity F and residual capacity R of battery 100 are different from each other in the full charge state of battery 100, or when residual capacity R of battery 100 is greater than full charge capacity display value $F_{disp}$ and/or full charge capacity F, residual capacity display value $R_{disp}$ may be corrected to the value identical to full charge capacity display value $F_{disp}$ of battery 100, or full charge capacity display value $F_{disp}$ and residual capacity display value $R_{disp}$ may be corrected to a value of an average of full charge capacity display value $F_{disp}$ and residual capacity display value $R_{disp}$. Furthermore, the difference between residual capacity R and full charge capacity F of battery 100 is calculated as correction value k. Residual capacity display value $R_{disp}$, or full charge capacity display value $F_{disp}$ and residual capacity display value $R_{disp}$ may be corrected by using this correction value k.

Moreover, the correction method of full charge capacity display value $F_{disp}$ is not limited to the above-described method. For example, full charge capacity display value $F_{disp}$ may be corrected by a following method. For example, when it is judged that residual capacity R of battery 100 is greater than full charge capacity F at step S112 (step S112=YES, a time period from time $T_{12}$ to time $T_{13}$, and a time period from time $T_{15}$ to time $T_{16}$ in FIG. 5), correction full charge capacity F' may be renewed by residual capacity R without calculating correction value k, as shown in a following equation (18). Then, full charge capacity display value $F_{disp}$ may be corrected to the renewed correction full charge capacity F', as shown in a following equation (19).

$$\text{correction full charge capacity } F' = \text{residual capacity } R \quad (18)$$

$$\text{full charge capacity display value } F_{disp} = \text{correction full charge capacity } F' \quad (19)$$

Moreover, when it is judged that residual capacity R of battery 100 is greater than full charge capacity F (step S112=YES), full charge capacity display value $F_{disp}$ may be corrected directly to residual capacity R of battery 100, as shown in a following equation (20).

$$\text{full charge capacity display value } F_{disp} = \text{residual capacity } R \quad (20)$$

Moreover, when it is judged that residual capacity R and full charge capacity F of battery 100 are identical to each other at step S113 (step S113=NO, time $T_{13}$ and time $T_{15}$ in FIG. 5), correction value k is calculated as shown in a following equation (21). Then, full charge capacity display value $F_{disp}$ may be corrected by using this calculated correction value k, as shown in following equations (22) and (23).

$$\text{correction value } k = \text{full charge capacity } F - \text{residual capacity } R \quad (21)$$

$$\text{correction full charge capacity } F' = \text{full charge capacity } F - \text{correction value } k \quad (22)$$

$$\text{full charge capacity display value } F_{disp} = \text{correction full charge capacity } F' \quad (23)$$

Moreover, in the above-described case, full charge capacity display value $F_{disp}$ may be corrected directly by full charge capacity F of battery 100, as shown in a following equation (24).

$$\text{full charge capacity display value } F_{disp} = \text{full charge capacity } F \quad (24)$$

Furthermore, when residual capacity R of battery 100 is not greater than full charge capacity display value $F_{disp}$ and/or full charge capacity F (step S111=NO, step S112=NO), it is further judged whether or not full charge capacity F of battery 100 is different from full charge capacity F at the previous process. When it is judged that full charge capacity F of battery 100 is not different from full charge capacity F at the previous process, full charge capacity display value $F_{disp}$ which is displayed at the present time may be directly displayed without correcting correction full charge capacity F' and full charge capacity display value $F_{disp}$. With this, full charge capacity display value $F_{disp}$ which is displayed at the present time is directly displayed during the time period from time $T_2$ to time $T_3$ without correcting correction full charge capacity F' and full charge capacity display value $F_{disp}$.

Full charge capacity calculating section 166 corresponds to a full charge capacity sensing section. Residual capacity calculating section 165 corresponds to a residual capacity sensing section. Battery capacity meter 150 corresponds to a displaying section. Display value calculating section 167 and correction value calculating section 168 correspond to a charge state sensing section, a correction section, and a control section.

The invention claimed is:

1. A battery capacity display apparatus comprising:
a full charge capacity calculating section configured to calculate a full charge capacity of a battery;
a residual capacity calculating section configured to calculate a residual capacity of the battery;
a displaying section configured to display the full charge capacity calculated by the full charge capacity calculating section, and the residual capacity calculated by the residual capacity calculating section, respectively, as a full charge capacity display value and a residual capacity display value;
a charge state sensing section configured to sense a charge state of the battery;
a correction section configured to correct the full charge capacity display value and/or the residual capacity display value which are displayed in the displaying section; and
a control section configured to display, in the displaying section, a corrected full charge capacity display value and/or a corrected residual capacity display value when the correction section corrects the full charge capacity display value and/or the residual capacity display value,
the correction section being configured
to compare the full charge capacity and the residual capacity in the full charge state when the charge state sensing section judges that the battery is in the full charge state, and
to correct the full charge capacity display value and/or the residual capacity display value which are displayed in the displaying section so as to decrease a difference between the full charge capacity display value and the residual capacity display value when the correction section judges that the full charge capacity and the residual capacity in the full charge state are different from each other,
wherein the correction section is configured to correct the full charge capacity display value and/or the residual capacity display value which are displayed in the displaying section so that the full charge capacity display value and the residual capacity display value are identical to each other when the correction section judges that the full charge capacity and the residual capacity in the full charge state are different from each other.

2. The battery capacity display apparatus as defined in claim 1, wherein the correction section is configured to calculate a difference between the full charge capacity and the residual capacity as a correction value when the correction section judges that the full charge capacity and the residual capacity in the full charge state are different from each other, and to correct the full charge capacity display value and/or the residual capacity display value by using this correction value.

3. The battery capacity display apparatus as defined in claim 2, wherein the correction section is configured to correct the full charge capacity display value and/or the residual capacity display value by using the correction value which is calculated at a previous process when the charge state sensing section judges that the battery is not in the full charge state.

4. The battery capacity display apparatus as defined in claim 1, wherein the correction section is configured to correct the full charge capacity display value only.

5. The battery capacity display apparatus as defined in claim 1, further comprising:
a voltage sensor configured to sense a terminal voltage of the battery;
a current sensor configured to sense a charge/discharge current value of the battery; and
a temperature sensor configured to sense a temperature of the battery,
wherein the terminal voltage, the charge/discharge current value and the temperature of the battery are used by the full charge capacity calculating section to calculate the full charge capacity of the battery, and
wherein the terminal voltage and the charge/discharge current value of the battery are used by the residual capacity calculating section to calculate the residual capacity of the battery.

6. A battery capacity display apparatus comprising:
a full charge capacity calculating section configured to calculate a full charge capacity of a battery;
a residual capacity calculating section configured to calculate a residual capacity of the battery;
a displaying section configured to display the full charge capacity calculated by the full charge capacity calculating section, and the residual capacity calculated by the residual capacity calculating section, respectively, as a full charge capacity display value and a residual capacity display value;

a charge state sensing section configured to sense a charge state of the battery;

a correction section configured to correct the full charge capacity display value and/or the residual capacity display value which are displayed in the displaying section; and a control section configured to display, in the displaying section, a corrected full charge capacity display value and/or a corrected residual capacity display value when the correction section corrects the full charge capacity display value and/or the residual capacity display value, the correction section being configured to compare the full charge capacity display value and/or the full charge capacity, and the residual capacity when the charge state sensing section judges that the battery is not in the full charge state, and to correct the full charge capacity display value and/or the residual capacity display value which are displayed in the displaying section so as to decrease a difference between the full charge capacity display value and the residual capacity display value when the correction section judges that the residual capacity is greater than the full charge capacity display value and/or the full charge capacity, wherein the correction section is configured to correct the full charge capacity display value and/or the residual capacity display value which are displayed in the displaying section so that the full charge capacity display value and the residual capacity display value are identical to each other when the correction section judges that the residual capacity is greater than the full charge capacity display value and/or the full charge capacity.

7. The battery capacity display apparatus as defined in claim 6, wherein the correction section is configured to calculate a difference between the full charge capacity and the residual capacity as a correction value when the correction section judges that the residual capacity is greater than the full charge capacity display value and/or the full charge capacity, and to correct the full charge capacity display value and/or the residual capacity display value by using the correction value.

8. The battery capacity display apparatus as defined in claim 7, wherein the correction section is configured to correct the full charge capacity display value and/or the residual capacity display value by using the correction value which is calculated at a previous process when the correction section judges that the residual capacity is not greater than the full charge capacity display value and/or the full charge capacity.

9. The battery capacity display apparatus as defined in claim 6, further comprising:

a voltage sensor configured to sense a terminal voltage of the battery;

a current sensor configured to sense a charge/discharge current value of the battery; and a temperature sensor configured to sense a temperature of the battery, wherein the terminal voltage, the charge/discharge current value and the temperature of the battery are used by the full charge capacity calculating section to calculate the full charge capacity of the battery, and wherein the terminal voltage and the charge/discharge current value of the battery are used by the residual capacity calculating section to calculate the residual capacity of the battery.

10. A battery capacity display method to display a full charge capacity of a battery and a residual capacity of the battery, respectively, as a full charge capacity display value and a residual capacity display value, the battery capacity display method comprising:

correcting the full charge capacity display value and/or the residual capacity display value so as to decrease a difference between the full charge capacity display value and the residual capacity display value when the battery is in the full charge state and the full charge capacity and the residual capacity in the full charge state are different from each other, and displaying a corrected full charge capacity display value and/or a corrected residual capacity display value, wherein the correcting step comprises correcting the full charge capacity display value and/or the residual capacity display value such that the full charge capacity display value and the residual capacity display value are identical to each other when the full charge capacity and the residual capacity in the full charge state are different from each other.

11. A battery capacity display method to display a full charge capacity of a battery and a residual capacity of the battery, respectively, as a full charge capacity display value and a residual capacity display value, the battery capacity display method comprising:

correcting the full charge capacity display value and/or the residual capacity display value so as to decrease a difference between the full charge capacity display value and the residual capacity display value when the battery is not in the full charge state and the residual capacity display value is greater than the full charge capacity display value and/or the full charge capacity, and displaying the corrected full charge capacity display value and/or the residual capacity display value, wherein the correcting step comprises correcting the full charge capacity display value and/or the residual capacity display value such that the full charge capacity display value and the residual capacity display value are identical to each other when the residual capacity is greater than the full charge capacity display value and/or the full charge capacity.

* * * * *